United States Patent
Nakagawa et al.

(10) Patent No.: US 7,475,967 B2
(45) Date of Patent: Jan. 13, 2009

(54) PIEZOELECTRIC ELEMENT, INK-JET HEAD WITH SAME, AND THEIR MANUFACTURING METHODS

(75) Inventors: Tohru Nakagawa, Shiga (JP); Hideo Torii, Osaka (JP)

(73) Assignee: Panasonic Corporation, Osaka (JP)

( * ) Notice: Subject to any disclaimer, the term of this patent is extended or adjusted under 35 U.S.C. 154(b) by 341 days.

(21) Appl. No.: 10/539,679

(22) PCT Filed: Sep. 24, 2004

(86) PCT No.: PCT/JP2004/014460

§ 371 (c)(1),
(2), (4) Date: Jun. 16, 2005

(87) PCT Pub. No.: WO2005/031886

PCT Pub. Date: Apr. 7, 2005

(65) Prior Publication Data

US 2006/0152553 A1  Jul. 13, 2006

(30) Foreign Application Priority Data

Sep. 25, 2003  (JP) ............................... 2003-333779

(51) Int. Cl.
*B41J 2/045* (2006.01)
*H01L 41/00* (2006.01)

(52) U.S. Cl. ........................................ 347/68; 310/358

(58) Field of Classification Search ............. 347/68–72; 310/358, 359; 252/62.9 PZ; 501/134
See application file for complete search history.

(56) References Cited

U.S. PATENT DOCUMENTS 4,894,384 A * 1/1990 Cecere et al. ................ 514/383
5,475,279 A * 12/1995 Takeuchi et al. ............. 310/331
6,294,860 B1 * 9/2001 Shimada et al. ............. 310/328

FOREIGN PATENT DOCUMENTS

| JP | 6-168624 A | 6/1994 |
|---|---|---|
| JP | 10-217458 A | 8/1998 |
| JP | 3206454 B2 | 7/2001 |
| JP | 2003-317230 A | 11/2003 |

* cited by examiner

*Primary Examiner*—Stephen D Meier
*Assistant Examiner*—Geoffrey Mruk
(74) *Attorney, Agent, or Firm*—Harness, Dickey & Pierce, P.L.C.

(57) ABSTRACT

A piezoelectric element 1 includes a lower electrode 2, a piezoelectric film 3 and an upper electrode 4 stacked in this order. The surface of the upper electrode 4 of the piezoelectric element 1 is exposed to a zirconium compound 6.

4 Claims, 9 Drawing Sheets

FIG. 13

PIEZOELECTRIC ELEMENT, INK-JET HEAD WITH SAME, AND THEIR MANUFACTURING METHODS

TECHNICAL FIELD

The present invention relates to a piezoelectric element including a first electrode, a second electrode and a lead compound-containing piezoelectric body sandwiched between the first and second electrodes, an inkjet head including the same and a method for manufacturing them.

BACKGROUND ART

As widely known, piezoelectric materials have the property of expanding and contracting upon voltage application. To apply the property to industrial use, there have been developed piezoelectric elements including a first electrode, a second electrode and a piezoelectric body sandwiched between the first and second electrodes. The piezoelectric elements have been used for ink discharge actuators in inkjet printers, magnetic head drive actuators in hard disk drives, as well as micropump drive actuators.

Figure 9:
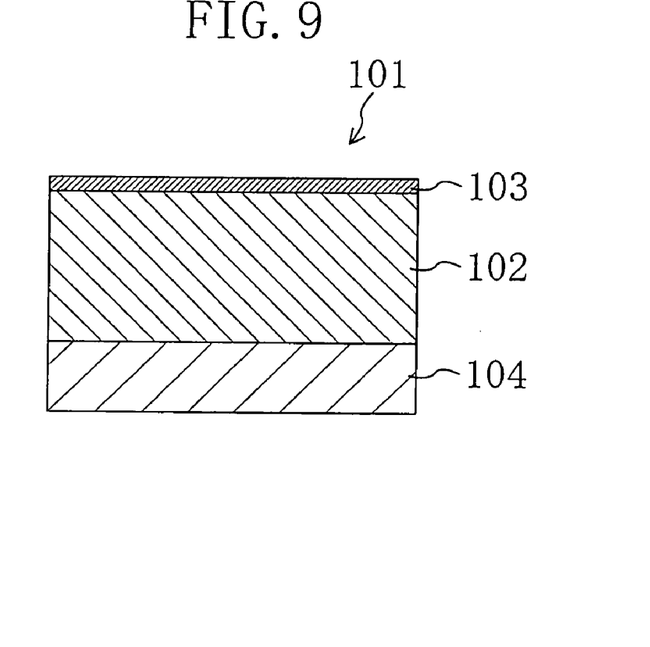
FIG. 9 is a sectional view of a piezoelectric element.

FIG. 9 is a schematic sectional view illustrating a basic piezoelectric element 101. The piezoelectric element 101 is prepared by forming a piezoelectric body 102 into a film and arranging electrodes 103 and 104 on the upper and lower surfaces of the piezoelectric body 102, respectively. In general, the piezoelectric body 102 is about 1 μm to 100 μm in thickness and the lower electrode 104 is larger in thickness than the upper electrode 103 to have greater rigidity than the upper electrode 103. The piezoelectric body 102 shows spontaneous polarization oriented toward the upper electrode 103.

Figure 10:
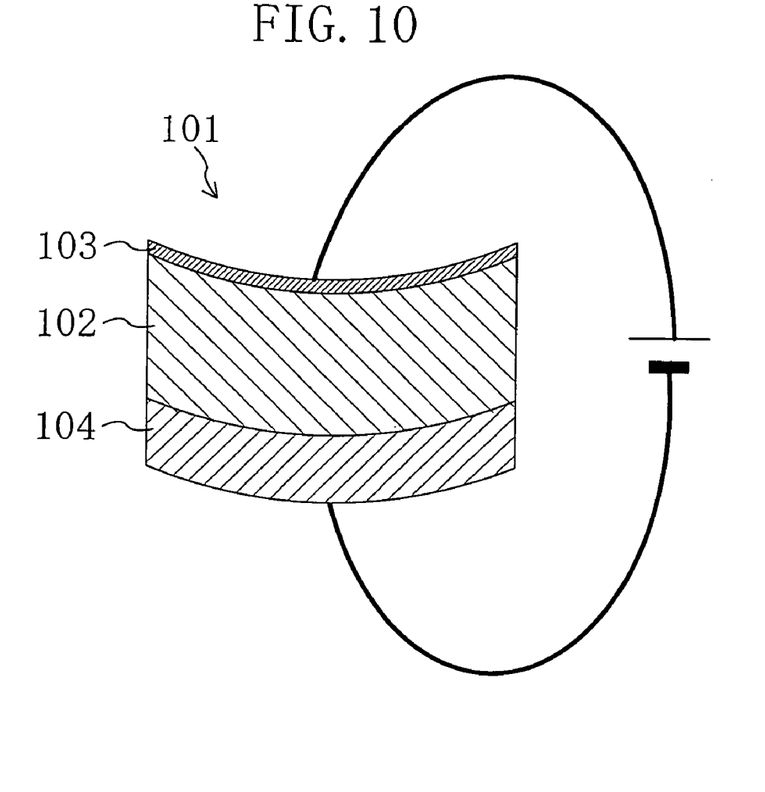
FIG. 10 is a view illustrating the state where a voltage is applied across electrodes of the piezoelectric element.

As shown in FIG. 10 the piezoelectric body 102 expands and contracts in the horizontal direction when a voltage is applied to both of the electrodes 103 and 104 such that the upper electrode 103 functions as a positive electrode. Since the lower electrode 104 is greater in rigidity than the upper electrode 103 as described above, part of the piezoelectric element 101 near the lower electrode 104 bulges, while part of the piezoelectric element 101 near the upper electrode 103 is dented.

To deform the piezoelectric element 101 as described above, the two electrodes 103 and 104 need to have different values of rigidity. The electrodes 103 and 104 are also required to be thinned down to such a degree that the piezoelectric body 102 is warped. Therefore, in general, the electrodes 103 and 104 are several nm to several μm in thickness.

There is a wide range of variations of materials for the piezoelectric body. Among them, a piezoelectric material containing a lead compound is industrially useful for its large piezoelectric constant. Examples of the lead compound-containing piezoelectric material include lead titanate (PT), lead zirconium titanate (PZT), as well as PZT added with magnesium, manganese, cobalt, iron, nickel, niobium, scandium, tantalum, bismuth or tantalum.

In general, the piezoelectric body has a polycrystalline structure. The higher crystallinity the piezoelectric body has, the more useful it is in industrial application because the directions of spontaneous polarization are more likely to be aligned and the piezoelectric constant becomes larger. Therefore, aiming at an improvement in crystallinity of the piezoelectric body, various methods for manufacturing the piezoelectric element have been studied. The piezoelectric elements formed by these manufacturing methods have improved in crystallinity. However, there has not been realized a perfect monocrystalline piezoelectric body in a large-area piezoelectric element. In inkjet printers and hard disk drives, piezoelectric elements have as large area as several hundred $\mu m^2$, and therefore they contain a number of grain boundaries therein.

The higher the field intensity applied to the piezoelectric body is, the higher the degree of deformation of the piezoelectric element becomes. Therefore, in some cases, field intensity as high as $10^4$ V/cm or more is applied. However, when a high voltage is applied to the lead-containing piezoelectric body in a high humidity environment, leakage current increases to cause dielectric breakdown.

It has not been clear on which principle dielectric breakdown occurs upon high voltage application in a high humidity environment. However, it is presumed that a cause of the dielectric breakdown is leakage current caused by moisture which seeps into grain boundaries and miniscule pinholes in the piezoelectric body. If the electrodes sandwiching the piezoelectric body are thick enough, the electrodes function as barriers to prevent moisture from seeping into the piezoelectric body. However, to make the piezoelectric element work, the thickness of the electrodes cannot be increased as described above. As a result, moisture passes through the pinholes in the electrodes to seep into the grain boundaries in the piezoelectric body, thereby causing dielectric breakdown.

Thus, it is presumed that modification to the grain boundaries and pinholes in the piezoelectric body allows an improvement in insulation reliability. Hereinafter, reference is made to examples of a conventional method for making modification to the grain boundaries and pinholes in the piezoelectric body. In this specification, provided that the piezoelectric body is an aggregate of a plurality of crystals (may be referred to as crystal grains), the grain boundary mentioned herein is a boundary between adjacent crystals. Although mathematically defined boundaries are faces having no line and thickness, the boundary mentioned herein includes faces having thicknesses. More specifically, a gap between adjacent crystals is referred to as the grain boundary. In this gap, other substances than the crystals exist. "Other substances than the crystals" are substances having structures and elemental composition different from those of the crystals. In some cases, the gap is completely filled with the other substances than the crystals, or in other cases it is partially filled with the other substances to leave space therein. When the space is left therein, in general, part or all of the surfaces of the crystals is covered with the other substances than the crystals. Further, the pinholes are holes which penetrate the piezoelectric body. If the gap between adjacent crystals penetrates the piezoelectric body, the grain boundary is a pinhole. Therefore, in a broad sense, the pinholes are included in the grain boundaries.

Japanese Patent No. 3206454 (hereinafter referred to as Patent Literature 1) discloses a method of sealing pinholes in composite oxide, such as PZT prepared by hydrosynthesis, with a resin or ceramic having a high dielectric constant. More specifically, the surface of the composite oxide is coated, sprayed or impregnated with a liquid prepared by dissolving a precursor of a resin material or ceramic in a solvent to fill the pinholes in the composite oxide with the liquid. Then, the liquid is solidified by drying or sintering.

Patent Literature 1 further discloses a method of sealing pinholes in composite oxide formed by hydrosynthesis on a metal substrate by immersing the metal substrate in an aqueous oxidizing solution and applying electric current thereto. In this method, the aqueous oxidizing solution passes through the pinholes in the composite oxide to contact the metal substrate, thereby causing an electrochemical reaction. As a result, the metal surface in the pinholes is turned to be insulating oxide, thereby sealing the pinholes.

Japanese Unexamined Patent Publication No. 10-217458 (hereinafter referred to as Patent Literature 2) discloses a piezoelectric element including a piezoelectric body sandwiched between two electrodes, wherein a dielectric material having a lower dielectric constant than that of the piezoelectric body exists in a grain boundary exposing region. Where the piezoelectric element is configured as described above, an electric field applied to the grain boundary upon voltage application between the electrodes is reduced to a greater extent than where nothing exists in the grain boundary exposing region. As a result, dielectric breakdown derived from the grain boundary is prevented.

However, the method of filling the pinholes in the composite oxide with an insulating material disclosed by Patent Literature 1 is defective as described below. More specifically, the density of the solid obtained after drying and sintering increases with an increase in concentration of the solid substance in the liquid used. This enhances the effect of sealing the pinholes. On the other hand, the increase in concentration of the solid substance also brings about an increase in viscosity of the liquid. Therefore, the liquid becomes less prone to go into the pinholes, whereby the sealing effect is reduced. Thus, this method has difficulty in completely sealing the pinholes.

Further, according to the method of filling the pinholes in the composite oxide formed on the metal substrate disclosed by Patent Literature 1, it is hard to produce the insulating oxide if the metal substrate is made of noble metal such as gold or platinum. Therefore, there is only a limited choice of usable materials for the metal substrate, such as titanium and aluminum.

In the method disclosed by Patent Literature 2, the dielectric material lies on the surface where the grain boundary is exposed. This reduces the voltage applied to the grain boundary, but a certain voltage is still applied to the grain boundary. Therefore, leakage current cannot be fully prevented.

Under these circumstances, the inventors of the present invention have conducted additional studies on the principle of how dielectric breakdown occurs upon high voltage application in a high humidity environment. As a result, they have found that a main cause of the dielectric breakdown in a high humidity environment is the deterioration of lead oxide present at the grain boundaries in the piezoelectric body caused by an electrochemical reaction between lead oxide and moisture.

Figure 11:
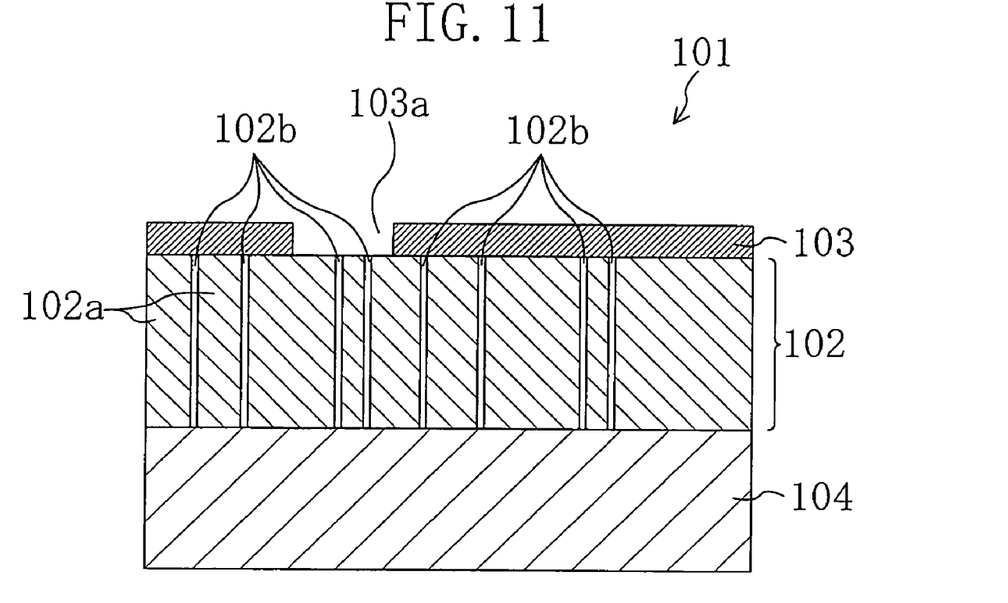
FIG. 11 is a sectional view of a piezoelectric element.
Figure 12:
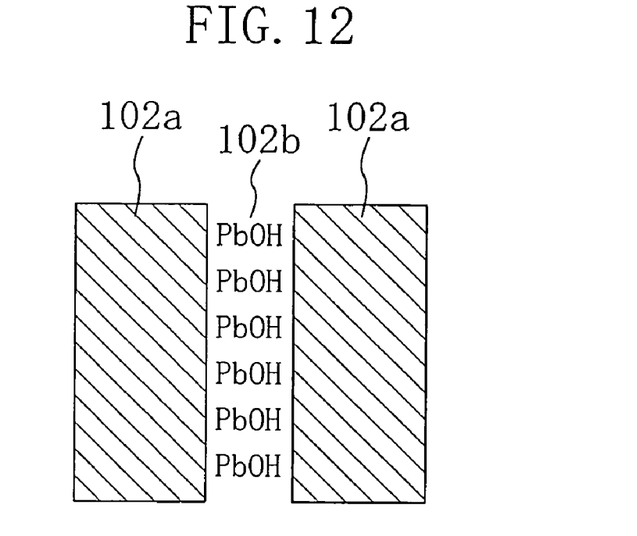
FIG. 12 is a view illustrating a reaction between lead oxide and moisture at grain boundaries in the piezoelectric body.
Figure 13:
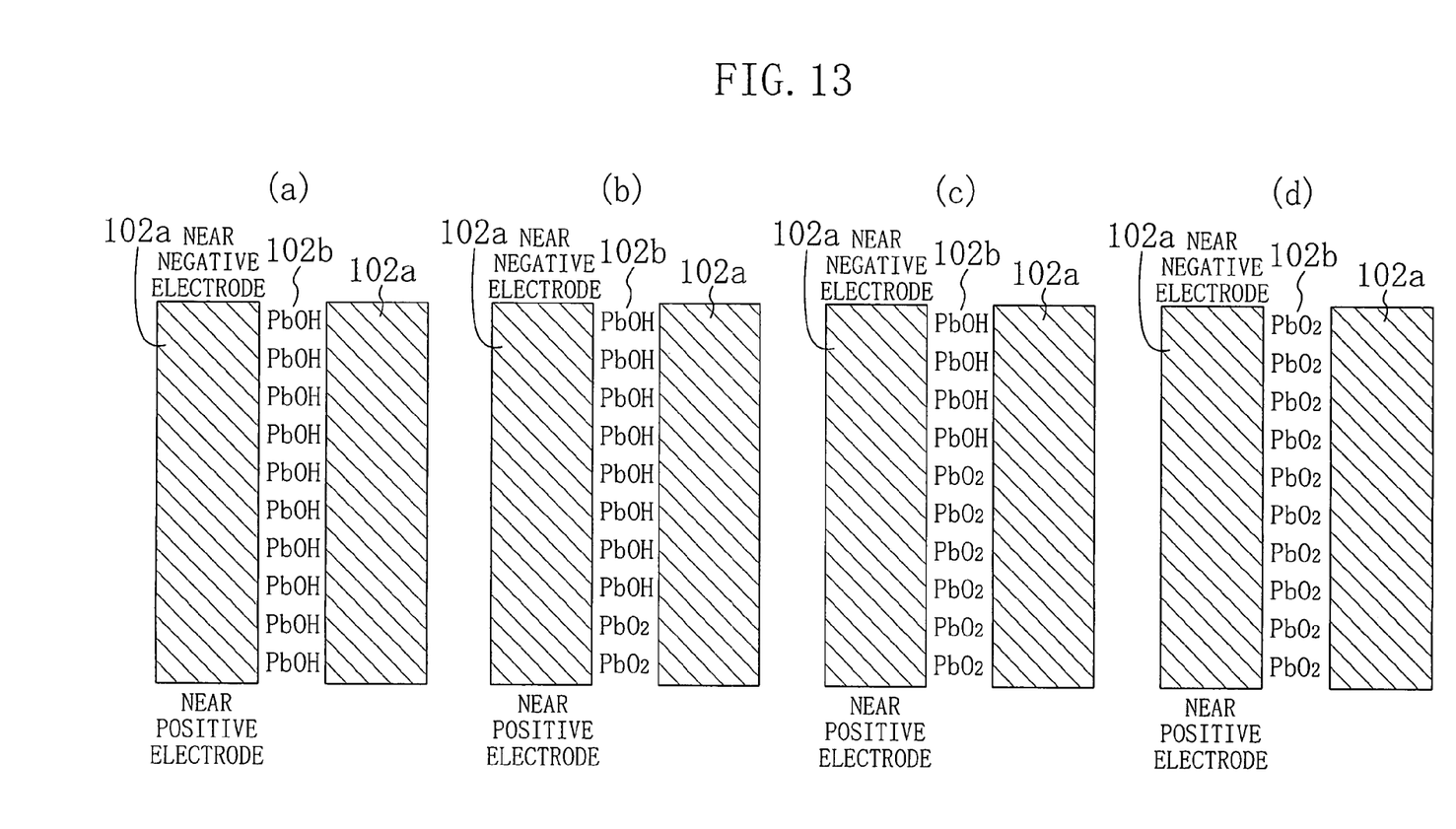
FIGS. 13(a) to 13(d) are views illustrating the principle of dielectric breakdown.

Hereinafter, the details of the principle are described. FIG. 11 shows a sectional view of a piezoelectric element 101 including a lead compound-containing piezoelectric body 102 sandwiched between two electrodes 103 and 104. In the piezoelectric element 101, the upper electrode 103 is formed thinner than the lower electrode 104 such that part of the piezoelectric element 101 near the lower electrode 104 bulges when a voltage is applied across the electrodes 103 and 104. Accordingly, a number of pinholes 103a are formed in the upper electrode 103. In a high humidity environment, moisture passes through the pinholes 103a in the upper electrode 103 to seep into grain boundaries 102b between columnar crystals 102a. Insulating PbO (lead oxide) present at the grain boundaries 102b reacts with seeping moisture to become $Pb(OH)_2$ (lead hydroxide) ($Pb(OH)_2$ is indicated as PbOH in FIG. 12; the same is also applied to FIG. 13). As shown in FIGS. 13(a) and 13(b), part of $Pb(OH)_2$ near the positive electrode is oxidized to $PbO_2$ (lead dioxide) having as high conductivity as that of metal. Further, as shown in FIGS. 13(b) and 13(c), the resulting $PbO_2$ functions as the positive electrode to oxidize adjacent part of $Pb(OH)_2$ to $PbO_2$. Then, eventually, the positive and negative electrodes are electrically connected via $PbO_2$ as shown in FIG. 13(d) to cause dielectric breakdown.

Thus, the inventors of the present invention have found that a piezoelectric element having high insulation reliability is realized by eliminating the above-described cause of dielectric breakdown.

In view of the above, the present invention has been achieved. An object of the present invention is to provide a technique of improving the insulation reliability of a piezoelectric element including a first electrode, a second electrode and a lead compound-containing containing piezoelectric body sandwiched between the first and second electrodes.

DISCLOSURE OF INVENTION

A first invention is directed to a piezoelectric element comprising a first electrode, a second electrode and a lead compound-containing piezoelectric body sandwiched between the first and second electrodes, wherein the piezoelectric body is made of an aggregate of a plurality of crystals, zirconium oxide exists at grain boundaries between the crystals and zirconium element exists at each said grain boundary in a larger composition ratio than lead element.

Since electrochemically stable zirconium oxide exists at the grain boundaries in the piezoelectric body, leakage current is prevented from passing through the grain boundaries. Accordingly, dielectric breakdown is prevented from occurring in a high humidity environment.

Further, since the zirconium element exists at each said grain boundary in a larger composition ratio than the lead element, the electrochemical property of the grain boundaries greatly depends on zirconium oxide present at the grain boundaries. Therefore, the grain boundaries become electrochemically stable with reliability and leakage current is surely prevented from passing through the grain boundaries. Thus, dielectric breakdown is surely prevented from occurring in a high humidity environment.

Moreover, since the grain boundaries are completely covered with an insulating film made of zirconium oxide, the occurrence of dielectric breakdown in a high humidity environment is prevented with higher reliability than in the piezoelectric element of Patent Literature 2.

According to a second invention, the piezoelectric body of the first invention is made of an aggregate of a plurality of columnar crystals which are oriented from one end to the other of the piezoelectric body in the thickness direction thereof.

Since the columnar crystals are oriented from one end to the other of the piezoelectric body in the thickness direction thereof, the directions of expansion and contraction of the columnar crystals are aligned. Thus, the piezoelectric element is provided with high deformability.

According to a third invention, the piezoelectric body of the first invention contains at least zirconium element, titanium element, lead element and oxygen element.

Thus, the piezoelectric body contains at least zirconium element, titanium element, lead element and oxygen element. For example, PZT represented by the composition formula $PbZr_xTi_{1-x}O_3$ (0<x<1) has been known as such a piezoelectric body. The piezoelectric body of this kind has a high piezoelectric constant, thereby providing a high performance piezoelectric element.

A fourth invention is directed to an inkjet head comprising: a head body including a nozzle and a pressure chamber which is communicated with the nozzle and contains ink; and a piezoelectric element which is arranged to face the pressure chamber at part of one of its surfaces intersecting the thickness direction of the piezoelectric element and applies a pressure to the ink in the pressure chamber such that the ink is discharged from the nozzle to a recording medium, wherein the piezoelectric element includes a first electrode, a second electrode and a lead compound-containing piezoelectric body sandwiched between the first and second electrodes, the piezoelectric body is made of an aggregate of a plurality of crystals, zirconium oxide exists at grain boundaries between the crystals and zirconium element exist at each said grain boundary in a larger composition ratio than lead element.

A fifth invention is directed to a method for manufacturing a piezoelectric element comprising a first electrode, a second electrode and a lead compound-containing piezoelectric body sandwiched between the first and second electrodes, the method comprising the steps of: stacking the first electrode, the piezoelectric body and the second electrode in this order; and exposing at least one of the first and second electrodes to a chemical substance containing at least one of zirconium alkoxide, zirconium acetyl acetonate and zirconium carboxylate after the stacking step.

Since at least one of the first and second electrodes is exposed to a chemical substance containing at least one of zirconium alkoxide, zirconium acetyl acetonate and zirconium carboxylate after the stacking step, lead oxide and lead hydroxide present at the grain boundaries are covered with electrochemically stable zirconium oxide to become electrochemically stable. As a result, leakage current is prevented from passing through the grain boundaries, and therefore dielectric breakdown is prevented from occurring in a high humidity environment.

Hereinafter, a detailed explanation is given of the principle of the present invention. As shown in FIGS. 11 to 13, moisture seeps into the grain boundaries in the piezoelectric body through the pinholes in the electrode and lead oxide present at the grain boundaries is converted into lead hydroxide, and then to conductive lead dioxide. This is a cause of dielectric breakdown in the conventional piezoelectric elements.

According to the present invention, at least one of the first and second electrodes is exposed to a chemical substance containing at least one of zirconium alkoxide, zirconium acetyl acetonate and zirconium carboxylate after the stacking step. Therefore, the chemical substance passes through the pinholes in the electrode to reach the grain boundaries. Since adsorbed water generally exists at the grain boundaries, zirconium alkoxide, zirconium acetyl acetonate or zirconium carboxylate contained in the chemical substance is hydrolyzed by the adsorbed water to become zirconium hydroxide. The following reaction formula (1) shows the hydrolysis of zirconium propoxide, which is an example of zirconium alkoxide.

$$Zr(OC_3H_7)_4 + 4H_2O \rightarrow Zr(OH)_4 + 4C_3H_7OH \quad (1)$$

Then, zirconium hydroxide reacts with lead hydroxide present at the grain boundaries as shown in the following reaction formula (2).

$$Zr(OH)_4 + Pb(OH)_2 \rightarrow Pb(OH)(OZr(OH)_3) + H_2O \quad (2)$$

Further, zirconium hydroxides cause dehydration to turn into zirconium oxide as shown in the following reaction formula (3).

$$nZr(OH)_4 \rightarrow nZrO_2 + 2nH_2O \quad (3)$$

The reaction formulae (1) to (3) show ideal reactions. In reality, zirconium alkoxide contained in the chemical substance is not completely hydrolyzed and therefore some alkoxyl groups remain unreacted. Likewise, zirconium hydroxide is not completely oxidized, thereby resulting some unreacted hydroxy groups. However, at least one of the first and second electrodes is exposed to the chemical substance after the stacking step. Therefore, on the whole, zirconium element at the grain boundaries takes a larger composition ratio than lead element. As a result, the grain boundaries exhibit the property of electrochemically stable zirconium oxide. Therefore, the grain boundaries become electrochemically stable with reliability and leakage current is surely prevented from passing through the grain boundaries. Thus, dielectric breakdown is surely prevented from occurring in a high humidity environment.

The reaction formulae (1) to (3) are also applicable to the cases where zirconium alkoxide is replaced with zirconium acetyl acetonate or zirconium carboxylate. In such a case, the propoxyl group ($OC_3H_7$) in the reaction formula (1) is substituted with groups corresponding to the compounds.

As described above, according to the present invention, electrochemically unstable lead oxide and lead hydroxide present at the grain boundaries are converted into electrochemically stable zirconium oxide and the zirconium element present at the grain boundaries takes a larger composition ratio than the lead element. As a result, leakage current is surely prevented from passing through the grain boundaries. Therefore, dielectric breakdown is surely prevented from occurring in a high humidity environment.

Further, according to the present invention, the grain boundaries become electrochemically stable by reaction between zirconium alkoxide, zirconium acetyl acetonate or zirconium carboxylate contained in the chemical substance and lead oxide and lead hydroxide present at the grain boundaries. Even if the concentration of the chemical substance in a solution is low, the above-described conversion effect is not varied. Therefore, unlike Patent Literature 1, there is no need of considering the viscosity of the solution.

The present invention is applicable to the manufacture of piezoelectric elements regardless of the kind of metal used as the first and second electrodes. Therefore, unlike Patent Literature 1, there is no need of limiting the kind of metal used for forming the first and second electrodes.

According to a sixth invention, the chemical substance used in the exposure step of the fifth invention is in a liquid state.

Since the chemical substance is in a liquid state in the exposure step, the chemical substance easily seeps into the grain boundaries in the piezoelectric body through the pinholes in the electrode. Thus, lead oxide and lead hydroxide present at the grain boundaries are surely converted into zirconium oxide.

According to a seventh invention, the chemical substance used in the exposure step of the fifth invention is in a gaseous state.

Since the chemical substance is in a gaseous state in the exposure step, the chemical substance easily seeps into the grain boundaries in the piezoelectric body through the pinholes in the electrode. Thus, lead oxide and lead hydroxide present at the grain boundaries are surely converted into zirconium oxide.

According to an eighth invention, the chemical substance used in the exposure step of the fifth invention is dissolved in an organic solvent.

Since the chemical substance is dissolved in an organic solvent, the chemical substance easily seeps into the grain boundaries in the piezoelectric body through the pinholes in the electrode. Thus, lead oxide and lead hydroxide present at the grain boundaries are surely converted into zirconium oxide.

According to a ninth invention, a voltage is applied across the first and second electrodes in the exposure step of the fifth invention.

Since a voltage is applied across the first and second electrodes when at least one of the first and second electrodes is exposed to the chemical substance, the reaction represented by the reaction formula (2) is accelerated near the positive electrode. As a result, the grain boundaries are more surely covered with electrochemically stable zirconium oxide, thereby preventing leakage current from passing through the grain boundaries with higher reliability. Thus, dielectric breakdown is more surely prevented from occurring in a high humidity environment.

Figure 1:
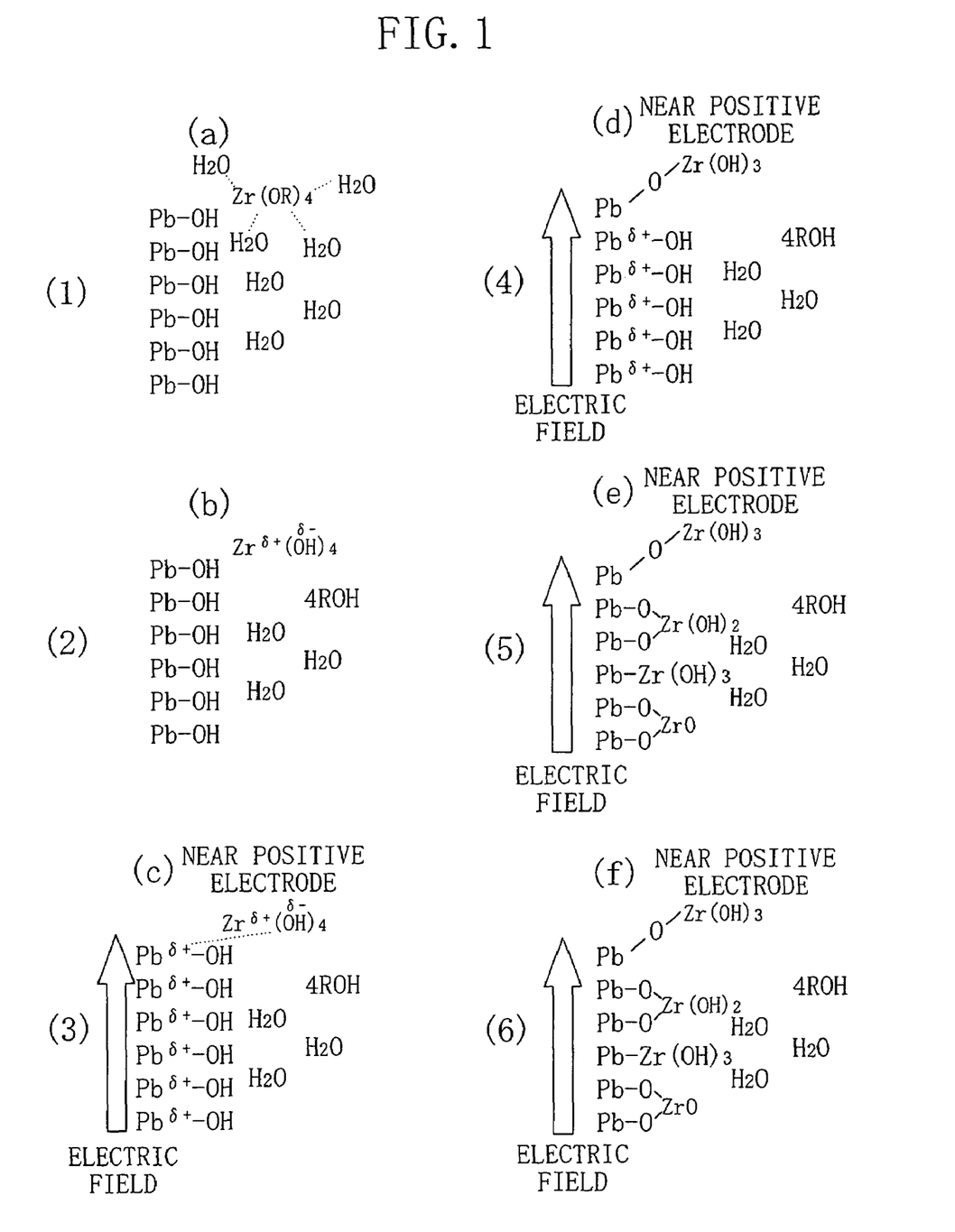
FIGS. 1(a) to 1(f) are views illustrating a reaction between lead hydroxide and a chemical substance at grain boundaries in a piezoelectric body according to an embodiment of the present invention.

Hereinafter, the principle of the present invention is described in detail. FIGS. 1(a) to 1(f) are views schematically illustrating the reaction between lead hydroxide and the chemical substance at the grain boundaries in the piezoelectric body under the condition that at least one of the first and second electrodes is exposed to the chemical substance and a voltage is applied across the first and second electrodes. In this case, the chemical substance contains zirconium alkoxide. However, it may contain zirconium acetyl acetonate or zirconium carboxylate. First, as shown in FIG. 1(a), lead oxide present at the grain boundaries reacts with adsorbed water present at the grain boundaries to become lead hydroxide $(Pb(OH)_2)$ ($Pb(OH)_2$ is indicated as PbOH in FIG. 1(a); the same is applied to FIGS. 1(b) to 1(d)). Further, as shown in FIG. 1(b), the grain boundaries also contain zirconium hydroxide $(Zr(OH)_4)$ resulted from the reaction between adsorbed water and zirconium alkoxide $(Zr(OR)_4)$ (see the reaction formula (1)). Since oxygen atoms in zirconium hydroxide are electrophilic, zirconium atoms in zirconium hydroxide are charged positive (positive charge is indicated as σ+ in FIG. 1(b)), while the oxygen atoms are charged negative (negative charge is indicated as σ− in FIG. 1(b)). Referring to FIG. 1(c), when a voltage is applied across the first and second electrodes, lead atoms in lead hydroxide near the positive electrode loses electrons to become electron-deficient (represented as σ+ in FIG. 1(c)). As a result, lead hydroxide and zirconium hydroxide cause dehydration to give a Pb—O—Zr bond as shown in FIGS. 1(d) to 1(f). Accordingly, lead hydroxide is covered with electrochemically stable zirconium oxide to be inert, thereby preventing leakage current from passing through the grain boundaries with higher reliability. Thus, dielectric breakdown is more surely prevented from occurring in a high humidity environment.

Zirconium alkoxide, zirconium acetyl acetonate or zirconium carboxylate contained in the chemical substance is ionized to carry either positive or negative charge. Therefore, if the polarity of the electrode to be exposed to the chemical substance is reversed from that of the charge of the chemical substance, the chemical substance easily seeps into the grain boundaries. Thus, the above-described conversion is carried out with improved efficiency.

According to a tenth invention, the method of the fifth invention further comprises the step of thermally treating the piezoelectric element at 100° C. or higher after the exposure step.

Since the piezoelectric element is subjected to thermal treatment at 100° C. or higher after the exposure step, unreacted zirconium hydroxides remaining in the grain boundaries cause dehydration to become electrochemically stable zirconium oxide. As a result, the grain boundaries are more surely covered with electrochemically stable zirconium oxide, thereby preventing leakage current from passing through the grain boundaries with higher reliability. Thus, dielectric breakdown is more surely prevented from occurring in a high humidity environment.

According to an eleventh invention, the stacking step of the fifth invention comprises the step of stacking the piezoelectric body on the first electrode by vacuum sputtering.

Since the stacking step comprises the step of stacking the piezoelectric body on the first electrode by vacuum sputtering, the piezoelectric body is obtained at a relatively low temperature as compared with the temperature for stacking the piezoelectric body by sintering and given with high crystallinity. Thus, the piezoelectric body is given with high deformability.

A twelfth invention is a method for manufacturing an inkjet head comprising: a head body including a nozzle and a pressure chamber which is communicated with the nozzle and contains ink; and a piezoelectric element which is arranged to face the pressure chamber at part of one of its surfaces intersecting the thickness direction of the piezoelectric element and applies a pressure to the ink in the pressure chamber such that the ink is discharged from the nozzle to a recording medium, wherein the piezoelectric element comprises a first electrode, a second electrode and a lead compound-containing piezoelectric body sandwiched between the first and second electrodes, the method comprising the steps of: stacking the first electrode, the piezoelectric body and the second electrode in this order; and exposing at least one of the first and second electrodes to a chemical substance containing at least one of zirconium alkoxide, zirconium acetyl acetonate and zirconium carboxylate after the stacking step.

—Effect of the Invention—

According to the present invention, electrochemically stable zirconium oxide exists at grain boundaries in the piezoelectric body and the zirconium element exists at each of the grain boundaries in a larger composition ratio than the lead element. Therefore, leakage current is surely prevented from passing through the grain boundaries. This prevents dielectric breakdown from occurring in a high humidity environment with reliability. Thus, a piezoelectric element is provided with high insulation reliability and long life and an inkjet head including the piezoelectric element is obtained.

After the first electrode, the piezoelectric body and the second electrode are stacked in this order, at least one of the first and second electrodes is exposed to the chemical substance containing at least one of zirconium alkoxide, zirconium acetyl acetonate and zirconium carboxylate to give an electrochemical change only to the grain boundaries. This prevents a change in piezoelectric property of the piezoelectric body derived from the exposure of at least one of the electrodes to the chemical substance.

Further, through the exposure of at least one of the first and second electrodes to the chemical substance after the stacking of the first electrode, the piezoelectric body and the second electrode in this order, the piezoelectric element improves in insulation reliability. Therefore, if at least one of the electrodes is re-exposed to the chemical substance after the piezoelectric element is worked to some extent, the insulation reliability is enhanced again.

BEST MODE FOR CARRYING OUT THE INVENTION

Hereinafter, a detailed explanation is given of embodiments of the present invention with reference to the drawings.

Embodiment 1

A piezoelectric element (piezoelectric actuator) 1 according to an embodiment of the present invention (see FIG. 2) includes a lower electrode (shared electrode) 2, a lead compound-containing piezoelectric film 3 formed on the lower electrode 2 and an upper electrode (separated electrode) 4 formed on the piezoelectric film 3. The piezoelectric element 1 is formed in the same manner as "Method for Forming Sample" described below. The piezoelectric element 1 is subjected to any one of the following treatments of: normal treatment; "normal treatment+thermal treatment"; electric field application; and "electric field application+thermal treatment" based on the evaluation results described below. The lower electrode 2, piezoelectric film 3 and upper electrode 4 correspond to the first electrode, piezoelectric body and second electrode of the present invention, respectively.

Figure 2:
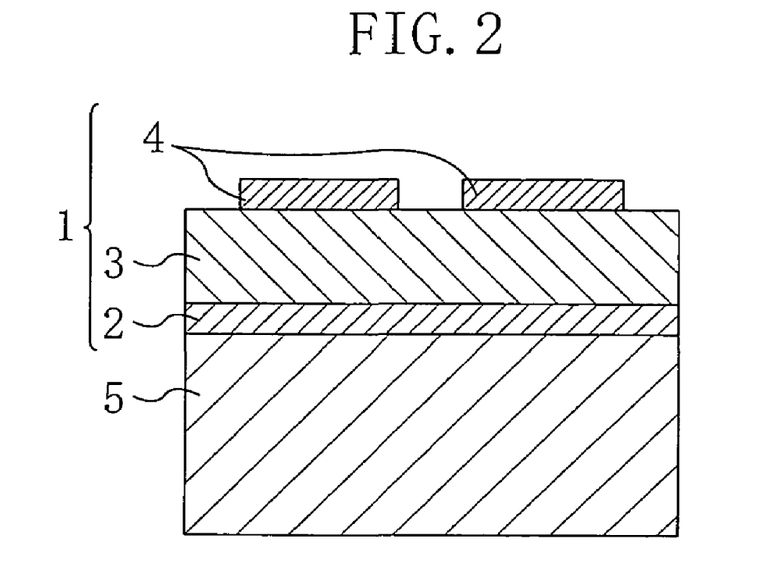
FIG. 2 is a sectional view illustrating a sample.

The piezoelectric film 3 is made of an aggregate of a plurality of columnar crystals which are oriented from one end of the piezoelectric film 3 near the lower electrode 2 to the other end near the upper electrode 4 in the thickness direction of the piezoelectric film 3 (in other words, they are oriented in the direction from the electrode surface of the lower electrode 2 to that of the upper electrode 4). The piezoelectric film 3 contains at least zirconium element, titanium element, lead element and oxygen element.

Between the columnar crystals, grain boundaries extend in the thickness direction of the piezoelectric film 3. Zirconium oxide exists at the grain boundaries. In the grain boundaries, zirconium element exists in a larger composition ratio than lead element.

EXAMPLE 1

—Method for Forming Sample—

Hereinafter, an explanation is given of a method for forming a sample. First, a lower electrode 2 of 70 nm in thickness made of Pt is formed by vapor deposition on a MgO substrate 5 of 25 mm in longitudinal length, 25 mm in lateral length and 0.2 mm in thickness. Then, a piezoelectric film 3 of 3 μm in thickness made of PZT ($PbZr_xTi_{1-x}O_3$ (0<x<1), lead zirconate titanate) is formed on the lower electrode 2 by vacuum sputtering. The vacuum sputtering conforms to the method of Kanno et al. (Applied Physics Letters, vol. 70, pp. 1378-1380, 1997). Then, finally, two upper electrodes 4 of 5 mm in longitudinal length, 5 mm in lateral length and 100 nm in thickness made of Pt, respectively, are formed on the piezoelectric film 3 by vacuum sputtering using a metal mask.

FIG. 2 is a schematic view illustrating the cross section of the sample. If the sample is used as the piezoelectric element 1, the MgO substrate 5 is generally removed by chemical etching or the like. However, in this example, the MgO substrate 5 is not removed. Even if the sample from which the MgO substrate 5 is removed is evaluated by the below-described evaluation method, the evaluation results are similar to those described below.

—Treatment Method—

Hereinafter, an explanation is given of methods of treatments to be done on the sample.

(Normal Treatment)

Figure 3:
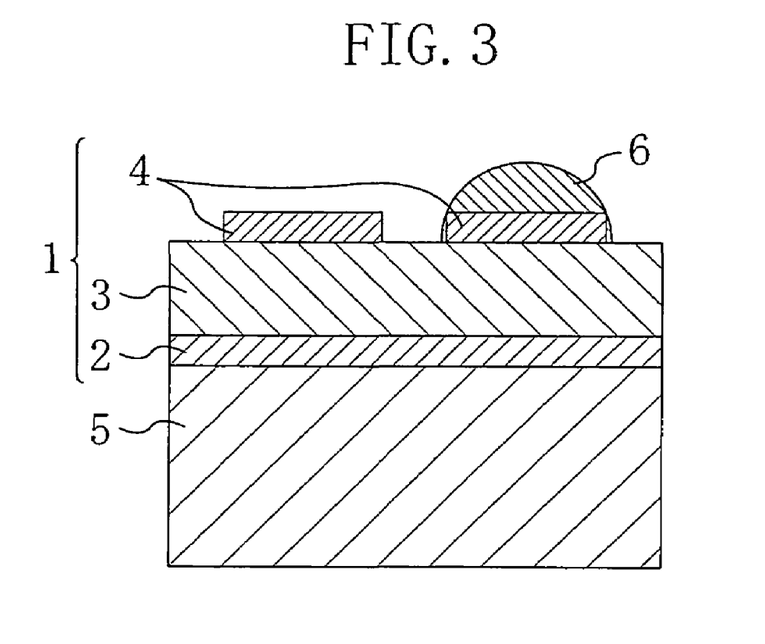
FIG. 3 is a view illustrating the sample under normal treatment.

First, the sample was introduced in a glove box filled with a dried nitrogen atmosphere. Then, as shown in FIG. 3, 0.2 ml of zirconium compound 6 (details thereof are described below) was dropped only onto the surface of one of the two upper electrodes 4 (right upper electrode 4 in FIG. 3) and left stand for 60 minutes. This allows the zirconium compound 6 to pass through pinholes in the right upper electrode 4 to seep into some of the grain boundaries in the piezoelectric film 3 at a position corresponding to the right upper electrode 4. Then, the sample was washed with a 2-propanol solution to remove the zirconium compound 6 adhered to the right upper electrode 4. Then, the sample was taken out of the glove box. The chemical substance of the present invention corresponds to the zirconium compound 6.

(Normal Treatment+Thermal Treatment)

After being subjected to the above-described normal treatment, the sample was baked 180° C. for an hour.

(Electric Field Application)

Figure 4:
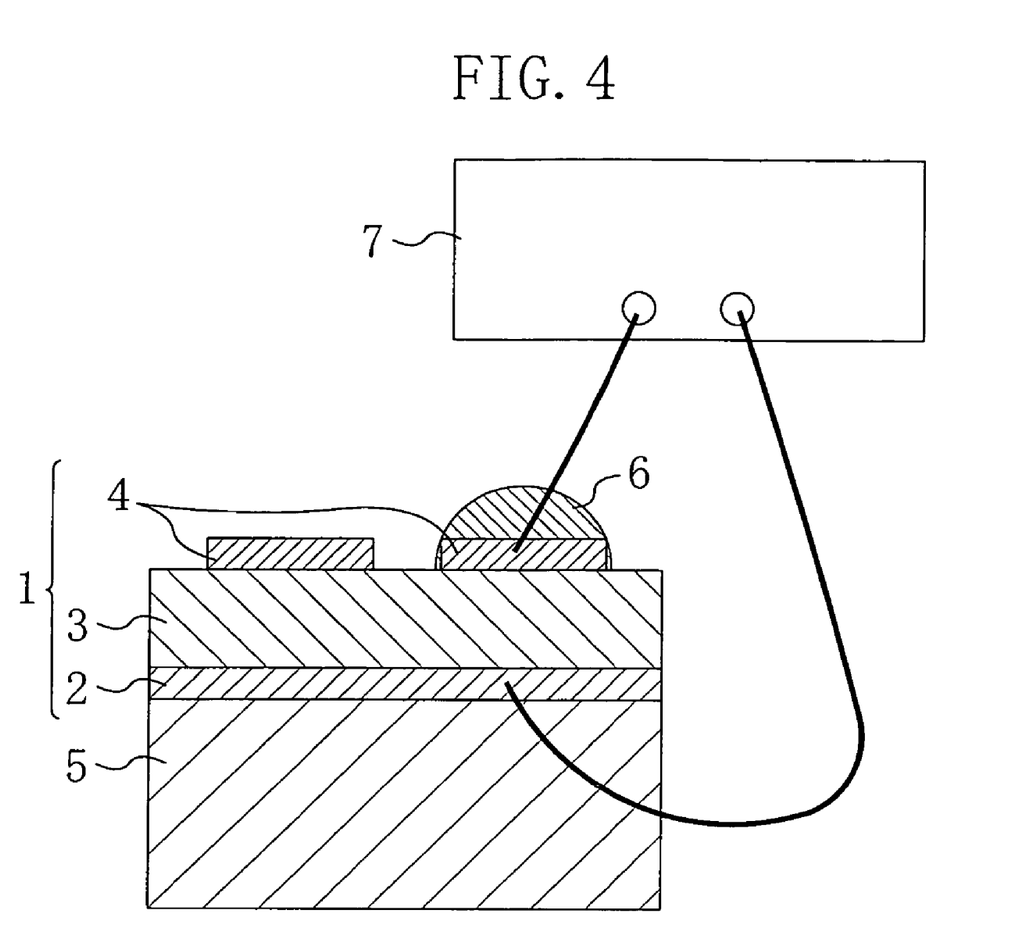
FIG. 4 is a view illustrating the sample under electric field application.

First, the sample was introduced in a glove box filled with a dried nitrogen atmosphere. Then, as shown in FIG. 4, 0.2 ml of zirconium compound 6 was dropped only onto the surface of one of the two upper electrodes 4 (right upper electrode 4 in FIG. 4) and left stand for 60 minutes. This allows the zirconium compound 6 to pass through pinholes in the right upper electrode 4 to seep into some of the grain boundaries in the piezoelectric film 3 at a position corresponding to the right upper electrode 4. While the sample was left stand, a DC voltage of 35 V was applied across the electrodes 2 and 4 from a constant voltage source 7 to operate the lower electrode 2 and the right upper electrode 4 as a positive electrode (plus electrode) and a negative electrode (minus electrode), respectively.

Then, the sample was washed with a 2-propanol solution to remove the zirconium compound 6 adhered to the right upper electrode 4. Then, the sample was taken out of the glove box.

(Electric Field Application+Thermal Treatment)

After being subjected to the above-described electric field application, the sample was baked at 180° C. for an hour.

In this way, the sample is subjected to any one of the above treatments, whereby electrochemically unstable lead oxide and lead hydroxide present at the grain boundaries are converted into zirconium oxide which is electrochemical stable, or excellent in insulation reliability.

Hereinafter, a detailed explanation is given of the principle of the above-described treatments. In the treatments described above, the zirconium compound 6 was dropped onto the surface of the right upper electrode 4. As a result, the zirconium compound 6 passes through the pinholes in the right upper electrode 4 to reach some of the gram boundaries in the piezoelectric film 3 at a position corresponding to the right upper electrode 4. Since adsorbed water generally present at the grain boundaries, the zirconium compound 6 is hydrolyzed to zirconium hydroxide by the adsorbed water. The following reaction formula (i) shows the hydrolysis of zirconium caprylate, which is one of examples of the zirconium compound 6.

$$Zr(OOC(CH_2)_6CH_3)_4 + 4H_2O \rightarrow Zr(OH)_4 + 4CH_3(CH_2)_6COOH \tag{i}$$

Further, zirconium hydroxide reacts with lead hydroxide present at the grain boundaries as shown in the following reaction formula (ii).

$$Zr(OH)_4 + Pb(OH)_2 \rightarrow Pb(OH)(OZr(OH)_3) + H_2O \tag{ii}$$

Subsequently, zirconium hydroxides cause dehydration to be zirconium oxide as shown in the following reaction formula (iii).

$$nZr(OH)_4 \rightarrow nZrO_2 + 2nH_2O \tag{iii}$$

In this way, lead oxide and lead hydroxide present at the grain boundaries are converted into electrochemically stable zirconium oxide.

Further, since 0.2 ml of zirconium compound 6 is dropped onto the surface of the right upper electrode 4 and left stand for 60 minutes as described above, zirconium element takes a larger composition ratio than lead element in some of the grain boundaries at a position corresponding to the right upper electrode 4 (in other words, the composition ratio of the zirconium element to the lead element in some of the grain boundaries at a position corresponding to the right upper electrode 4 exceeds 1).

—Zirconium Compounds Used for Sample Treatments—

Listed below are examples of the zirconium compound 6 used in the above-described sample treatments.

(1) Zirconium caprylate ($Zr(OOC(CH_2)_6CH_3)_4$):

This zirconium caprylate is in a liquid state.

(2) 2-propanol solution dissolving 50 vol % (percent by volume) of zirconium caprylate (3) Zirconium t-butoxide ($Zr(OCH_2(CH_3)_3)_4$)

This zirconium t-butoxide is in a liquid state.

(4) 2-propanol solution dissolving 50 vol % of zirconium t-butoxide (5) Zirconium acetyl acetonate ($Zr(CH_3COCHCOCH_3)_4$)

This zirconium acetyl acetonate is in a liquid state.

(6) 2-propanol solution dissolving 50 vol % of zirconium acetyl acetonate

—Evaluation Method—

The samples treated by the above-described methods were placed in a thermo-humidistat in which the atmosphere was kept at a temperature of 25° C. and a relative humidity of 80%, and then a DC voltage of 35 V was applied across the electrodes 2 and 4 to operate the lower and upper electrodes 2 and 4 as the positive and negative electrodes, respectively. The value of leakage current passing through the piezoelectric film 3 was measured for 100 hours from the initiation of the voltage application.

—Evaluation Results—

Table 1 shows the evaluation results.

TABLE 1

(Values on the upper lines are measured after a lapse of an hour from the initiation of voltage application and those on the lower lines are measured after a lapse of 100 hours from the initiation of voltage application)

| Zirconium compound used | Treatment method | | | |
| --- | --- | --- | --- | --- |
| | Normal treatment | Normal treatment + thermal treatment | Electric field application | Electric field application + thermal treatment |
| Zirconium caprylate | 10 nA | 3 nA | 1 nA | 0.3 nA |
| | 10 nA | 4 nA | 1 nA | 0.3 nA |
| 2-propanol solution dissolving 50 vol % of zirconium caprylate | 30 nA | 5 nA | 5 nA | 1 nA |
| | 30 nA | 6 nA | 6 nA | 1 nA |
| Zirconium t-butoxide | 15 nA | 5 nA | 1 nA | 0.5 nA |
| | 15 nA | 6 nA | 2 nA | 0.6 nA |
| 2-propanol solution dissolving 50 vol % of zirconium t-butoxide | 40 nA | 10 nA | 8 nA | 3 nA |
| | 40 nA | 12 nA | 8 nA | 3 nA |
| Zirconium acetyl acetate | 10 nA | 3 nA | 2 nA | 0.5 nA |
| | 10 nA | 3 nA | 2 nA | 0.6 nA |
| 2-propanol solution dissolving 50 vol % of zirconium acetyl acetate | 30 nA | 6 nA | 3 nA | 0.5 nA |
| | 30 nA | 7 nA | 4 nA | 0.6 nA |
| None | 10 mA Dielectric breakdown (100 mA or more) | 10 mA Dielectric breakdown (100 mA or more) | 10 mA Dielectric breakdown (100 mA or more) | 10 mA Dielectric breakdown (100 mA or more) |

The bottom row in Table 1 (the row written with "None" in Table 1) indicates values of leakage current passing through part of the piezoelectric film 3 at a position corresponding to the untreated one of the upper electrodes 4 (left upper electrode 4 in FIGS. 3 and 4). In every box of Table 1, values in the upper lines are leakage current values measured after a lapse of an hour from the initiation of voltage application, while those in the lower lines are leakage current values measured after a lapse of 100 hours from the initiation of voltage application. In this example, it is defined that dielectric breakdown occurs when the leakage current value is 100 mA or more.

In part of the piezoelectric film 3 at a position corresponding to the untreated upper electrode 4, leakage current increased as time went by and dielectric breakdown occurred after a lapse of 100 hours from the initiation of voltage application (see the bottom row of Table 1).

On the other hand, in part of the piezoelectric film 3 at a position corresponding to the treated upper electrode 4, leakage current was kept constant from immediately after the initiation of voltage application to 100 hours after the initiation. The leakage current value was several ten nA or less (see Table 1).

From the above evaluation results, it was ascertained that the exposure of the upper electrode 4 of the sample to the zirconium compound 6 allows improvement in insulation reliability.

When the sample was subjected to thermal treatment in addition to the normal treatment or the electric field application, leakage current decreased more than that in the sample subjected only to the normal treatment or the electric field application (see Table 1). It is presumed that a cause of the decrease is that the thermal treatment activated the chemical reaction represented by the reaction formula (iii), whereby unreacted zirconium hydroxides present at the grain boundaries in the piezoelectric film 3 caused dehydration to become electrochemically stable zirconium oxide. As a result, the grain boundaries improved in insulation property.

It was also ascertained that the leakage current in the sample subjected to the electric field application decreased more than that in the sample subjected to the normal treatment (see Table 1). It is presumed that the electric field application accelerated the reaction represented by the reaction formula (ii) near the positive electrode to enhance the conversion of lead oxide present at the grain boundaries in the piezoelectric film 3.

Hereinafter, the principle of the electric field application is described in detail. First, lead oxide (PbO) present at the grain boundaries reacts with adsorbed water existing in the grain boundaries to become lead hydroxide ($Pb(OH)_2$). The grain boundaries also include zirconium hydroxide ($Zr(OH)_4$) resulted from the reaction between adsorbed water and the zirconium compound 6 (see the reaction formula (i)). Since oxygen atoms in zirconium hydroxide are electrophilic, zirconium atoms in zirconium hydroxide are charged positive, while oxygen atoms are charged negative. At this time, if a DC voltage of 35 V is applied across the electrodes 2 and 4 such that the lower electrode 2 serves as the positive electrode, lead atoms in lead hydroxide near the lower electrode 2 lose electrons to be electron-deficient. As a result, lead hydroxide and zirconium hydroxide cause dehydration to give a Pb—O—Zr bond. Thus, lead hydroxide is covered with electrochemically stable zirconium oxide compound to be inert.

—Effect—

As described above, according to the present embodiment, leakage current is prevented from passing through the grain boundaries because of the presence of electrochemically stable zirconium oxide at the grain boundaries in the piezoelectric film 3. As a result, dielectric breakdown is prevented from occurring in a high humidity environment. Further, since the zirconium element exists at the grain boundaries in a larger composition ration than the lead element, the electrochemical property of the grain boundaries depends on zirconium oxide present at the grain boundaries. Therefore, the grain boundaries become electrochemically stable with reliability and leakage current is surely prevented from passing through the grain boundaries. As a result, dielectric breakdown is surely prevented from occurring in a high humidity environment. Thus, the piezoelectric element 1 is provided with high insulation reliability and long life.

After the lower electrode 2, piezoelectric film 3 and upper electrode 4 are stacked in this order, the upper electrode 4 is exposed to the zirconium compound 6. Therefore, lead oxide and lead hydroxide present at the grain boundaries are covered with electrochemically stable zirconium oxide to become electrochemically stable. As a result, leakage current is prevented from passing through the grain boundaries and dielectric breakdown is prevented from occurring in a high humidity environment.

Further, through the exposure of the upper electrode 4 to the zirconium compound 6 after the lower electrode 2, piezoelectric body 3 and upper electrode 4 are stacked in this order, the zirconium element at the grain boundaries takes a larger composition ratio than the lead element on the whole. This allows the grain boundaries to show the property of electrochemically stable zirconium oxide. As a result, the grain boundaries become electrochemically stable with reliability and leakage current is surely prevented from passing through the grain boundaries. Thus, dielectric breakdown is surely prevented from occurring in a high humidity environment.

Upon exposure of the upper electrode 4 to the zirconium compound 6, the zirconium compound 6 is in a liquid state or dissolved in an organic solvent. Therefore, the zirconium compound 6 easily seeps into the grain boundaries in the piezoelectric film 3 through the pinholes in the upper electrode 4. As a result, lead oxide and lead hydroxide present at the grain boundaries are surely converted into zirconium oxide.

In the above-mentioned electric field application, while the upper electrode 4 is exposed to the zirconium compound 6, a voltage is applied across the electrodes 2 and 4 such that the lower electrode 2 functions as the positive electrode. Therefore, the reaction represented by the reaction formula (ii) is accelerated near the lower electrode 2. As a result, the grain boundaries are covered with electrochemically stable zirconium oxide with higher reliability and leakage current is more surely prevented from passing through the grain boundaries. Thus, dielectric breakdown is prevented from occurring in a high humidity environment with higher reliability.

Zirconium alkoxide, zirconium acetyl acetonate or zirconium carboxylate contained in the zirconium compound 6 is ionized to carry either positive or negative charge. Therefore, upon electric field application, the polarity of the upper electrode 4 to be exposed to the zirconium compound 6 is reversed from that of the charge of the zirconium compound 6. This allows the zirconium compound 6 to seep into the grain boundaries easily, thereby improving the efficiency of the conversion.

After the exposure of the upper electrode 4 to the zirconium compound 6, the piezoelectric element 1 is subjected to thermal treatment at 180° C. Therefore, unreacted zirconium hydroxides remaining in the grain boundaries cause dehydration to become electrochemically stable zirconium oxide. As a result, the grain boundaries are more surely covered with electrochemically stable zirconium oxide and leakage current is prevented from passing through the grain boundaries with higher reliability. Thus, dielectric breakdown is more surely prevented from occurring in a high humidity environment.

Further, the columnar crystals are oriented from one end of the piezoelectric film 3 near the lower electrode 2 to the other end near the upper electrode 4 in the thickness direction of the piezoelectric film 3. Therefore, the directions of expansion and contraction of the columnar crystals are aligned. Thus, the piezoelectric element 1 is provided with high deformability.

The piezoelectric film 3 has a high piezoelectric constant because it is made of PZT. Therefore, the piezoelectric element 1 is provided with high performance.

The step of stacking the lower electrode 2, piezoelectric film 3 and upper electrode 4 in this order includes the step of stacking the piezoelectric film 3 on the lower electrode 2 by vacuum sputtering. This allows obtaining the piezoelectric film 3 with high crystallinity at a relatively low temperature as compared with the temperature for stacking the piezoelectric film by sintering. Thus, the piezoelectric element 1 is provided with high deformability.

In the present embodiment, the thermal treatment is carried out at 180° C. for an hour after the normal treatment or electric field application. However, the thermal treatment may be carried out at a temperature of 100° C. or higher, preferably 180° C. or higher.

In the electric field application in the present embodiment, a voltage of 35 V is applied across the electrodes 2 and 4. However, the present invention is not limited thereto. The voltage to be applied across the electrodes 2 and 4 may be varied depending on the composition and thickness of the piezoelectric film 3 or the zirconium compound 6 used in the above treatments.

Embodiment 2

In this embodiment, the piezoelectric element 1 is substantially the same as that of Embodiment 1 except that the piezoelectric element 1 is treated in a different manner from that of Embodiment 1.

The piezoelectric element 1 of the present embodiment is treated by the following method based on the evaluation results described below.

EXAMPLE 2

—Treatment Method—

Figure 5:
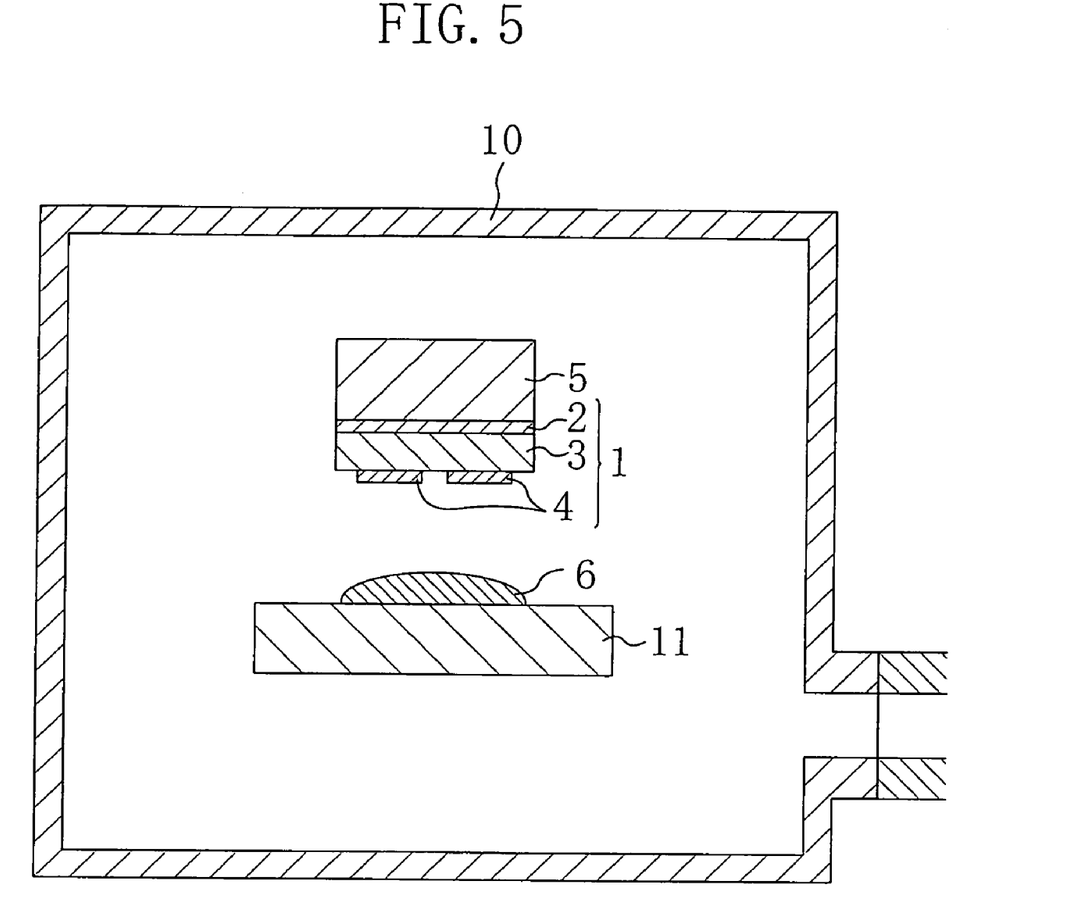
FIG. 5 is a sectional view of a vacuum vessel containing the sample, a heater and a zirconium compound.

Hereinafter, an explanation is given of a method for treating the sample (the same sample as that used in Example 1). First, as shown in FIG. 5, the sample was placed in a vacuum vessel 10 and a heater 11 was arranged in the vacuum vessel 10 at about 50 mm away from the sample. Then, powdered zirconium ethoxide ($Zr(OCH_2CH_3)_4$) 6 was placed on the heater 11. Atmospheric pressure in the vacuum vessel 10 was set to 1 Pa, and then the temperature of the heater 11 was set to 300° C. to allow zirconium ethoxide 6 on the heater 11 to evaporate. Thus, the evaporated zirconium ethoxide 6 seeped into the grain boundaries in the piezoelectric film 3 through the pinholes in the upper electrode 4. Then, the sample was taken out of the vacuum vessel 10 and evaluated by the same evaluation method as in Example 1.

—Evaluation Results—

The leakage current value measured after a lapse of 24 hours from the initiation of voltage application was 10 nA. From the evaluation results, it was ascertained that treating the sample by the method of this example allows an improvement in insulation reliability.

—Effect—

As described above, according to the present embodiment, the upper electrode 4 is exposed to the zirconium compound 6 in a gaseous state. This allows the zirconium compound 6 to pass through the pinholes in the upper electrode 4 to seep easily into the grain boundaries in the piezoelectric film 3. Therefore, lead oxide and lead hydroxide present at the grain boundaries are surely converted to zirconium oxide.

Embodiment 3

The present embodiment is directed to one of the piezoelectric elements 1 according to Embodiment 1 applied to an inkjet head 20.

Figure 6:
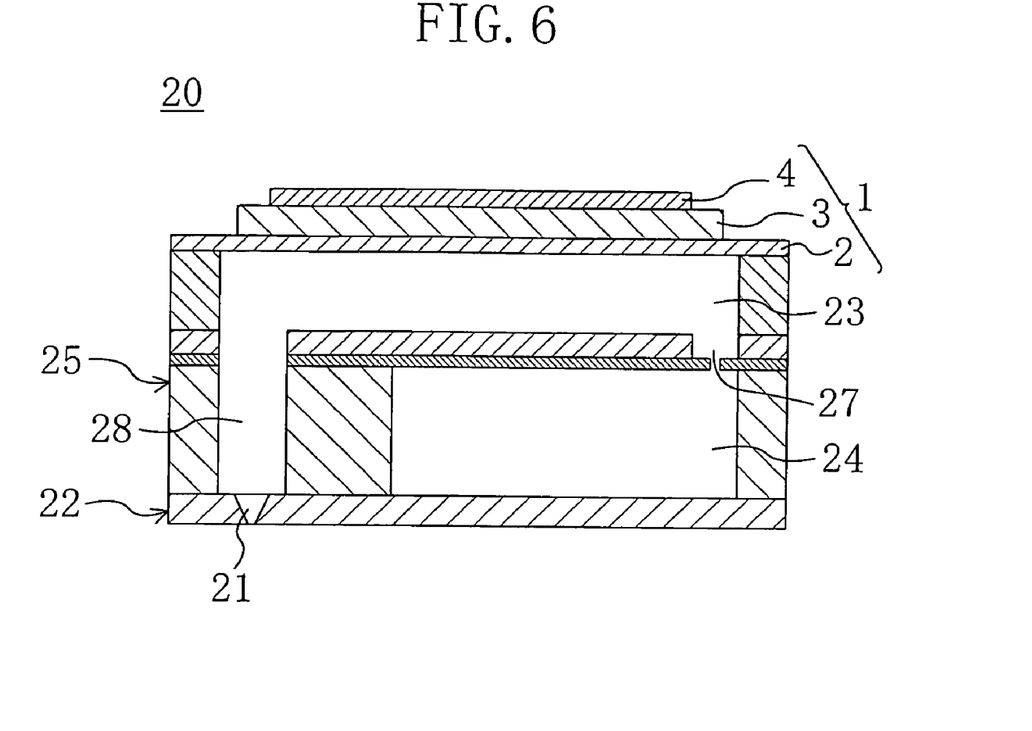
FIG. 6 is a sectional view of an inkjet head.
Figure 7:
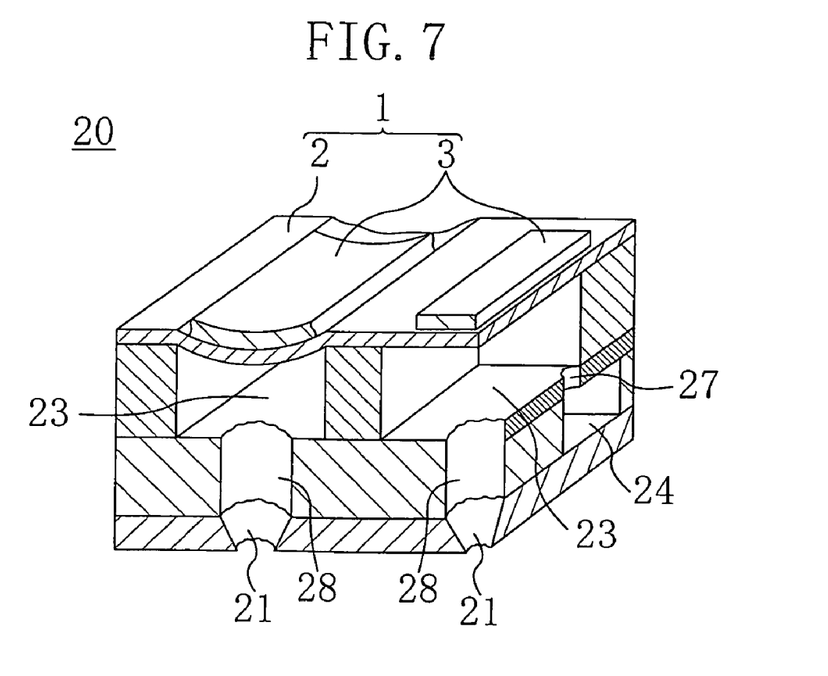
FIG. 7 is an oblique sectional view of the inkjet head.
Figure 8:
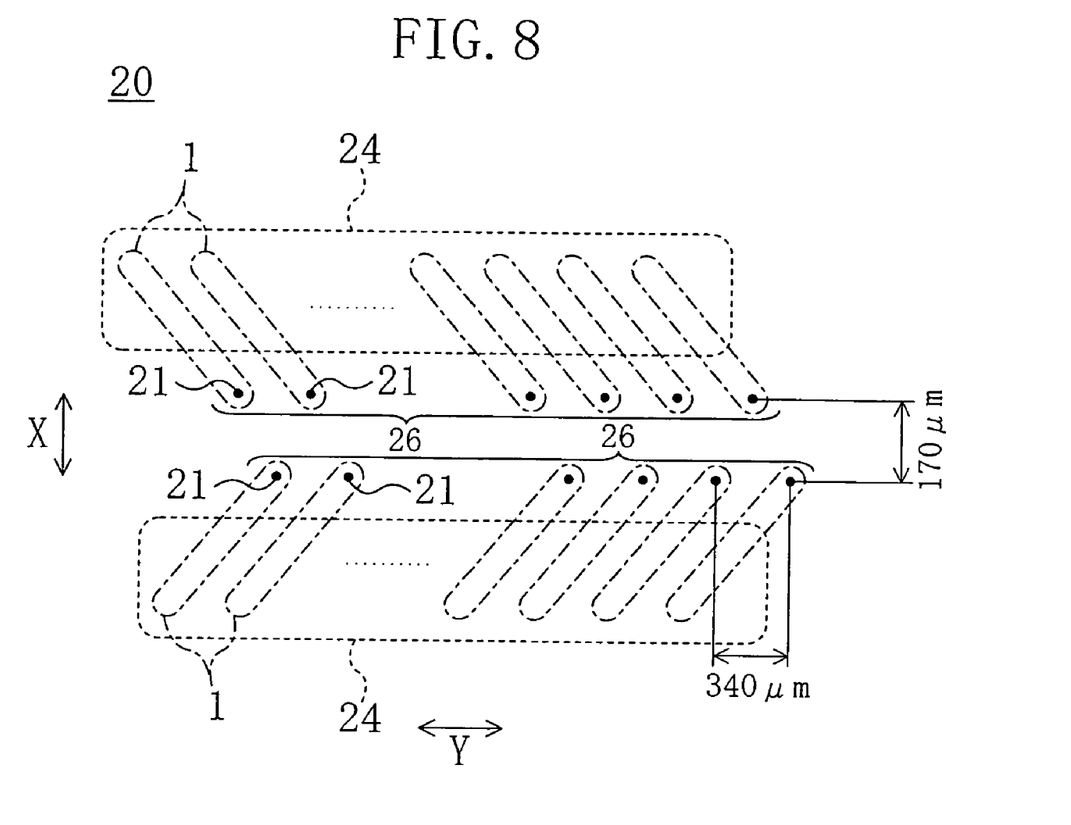
FIG. 8 is a bottom view of the inkjet head.

As shown in FIGS. 6 to 8, the inkjet head 20 is installed in an inkjet printer (not shown) and discharges ink droplets onto recording paper to perform recording. The bottom surface of a nozzle plate 22 of the inkjet head 20 and the recording paper have a distance of about 1 mm therebetween, for example. In this embodiment, the inkjet head 20 was formed by a known manufacturing method.

As shown in FIGS. 6 and 7, the inkjet head 20 includes: the nozzle plate 22 provided with a plurality of nozzle holes 21; an ink flow channel providing member 25 formed with a plurality of pressure chambers 23 which are communicated with the nozzle holes 21 and contain ink, respectively, and a common ink chamber 24; and a plurality of piezoelectric elements 1. Each of the piezoelectric elements 1 is arranged to face the pressure chamber 23 at part of one of its surfaces intersecting the thickness direction of the piezoelectric element and applies a pressure to the ink in the pressure chamber 23 such that the ink is discharged from the nozzle to the recording paper.

As shown in FIG. 8, the nozzle plate 22 is formed with two nozzle rows 26 each including 40 nozzle holes 21 arranged at intervals of 340 μm along the sub scanning direction Y (the direction in which the recording paper is transferred). The nozzle rows 26 are arranged at an interval of 170 μm in the main scanning direction X (the direction orthogonal to the sub scanning direction Y). In FIG. 8, a broken line depicts the common ink chambers 24 and an alternate long and short dashed line shows the piezoelectric elements 1. As clearly shown in FIG. 8, each of the common ink chambers 24 is connected to the 40 pressure chambers 23 arranged in the sub scanning direction Y. Therefore, the 40 nozzle holes 21 in each of the nozzle rows 26 discharge the ink of the same color.

The pressure chambers 23 are arranged at regular intervals in the sub scanning direction Y. As shown in FIGS. 6 and 7, each of the pressure chambers 23 has a substantially narrow rectangular cross section. Each of the pressure chambers 23 has an ink supply hole 27 formed at one end of the bottom thereof in the longitudinal direction and an ink discharge channel 28 formed at the other end. The pressure chambers 23 are communicated with the common ink chamber 24 through the ink supply holes 27, respectively, and with the nozzle holes 21 through the ink discharge channels 28, respectively.

The piezoelectric elements 1 are formed on the ink flow channel providing member 25. Each of the piezoelectric elements 1 includes an oscillation plate 2 of 3 μm in thickness made of Cr, a piezoelectric film 3 of 3 μm in thickness formed on the oscillation plate 2 and an upper electrode 4 (not shown in FIG. 7) of 20 nm in thickness made of Pt formed on the piezoelectric film 3. The oscillation plate 2 is shared among the piezoelectric elements 1. The oscillation plate 2 also functions as a lower electrode. The piezoelectric film 3 is formed on the oscillation plate 2 by vacuum sputtering in the same manner as in Embodiment 1. The piezoelectric film 3 and the upper electrode 4 are formed at a position corresponding to the pressure chamber 23.

The piezoelectric element 1 of the present embodiment is treated by the following treatment method based on the evaluation results described below.

EXAMPLE 3

—Treatment Method—

First, an inkjet head 20 including 200 piezoelectric elements 1 is placed in a glove box filled with a nitrogen atmosphere and zirconium caprylate is dropped onto the upper electrode 4. This zirconium caprylate is in a liquid state. Then, a DC voltage of 35 V was applied across the oscillation plate 2 and the upper electrode 4 for an hour such that the oscillation plate 2 functions as a positive electrode. This allows zirconium caprylate to seep into the grain boundaries through the pinholes in the upper electrode 4. Then, zirconium caprylate dropped onto the upper electrode 4 was wiped away with Bemcot impregnated with propyl alcohol, Then, the inkjet head 20 was taken out of the glove box.

—Evaluation Method—

With respect to 200 piezoelectric elements 1 of the inkjet head 20 treated by the above-described treatment method, a DC voltage of 35 V was applied across the oscillation plate 2 and the upper electrode 4 in an atmosphere at a temperature of 25° C. and relative humidity of 80% to operate the oscillation plate 2 as a positive electrode. Then, the leakage current value passing through the piezoelectric film 3 was measured after the voltage application. Further, with respect to 200 piezoelectric elements 1 of the inkjet head 20 which had not been treated by the above-described treatment method, the leakage current value was also measured in the same manner as the above.

—Evaluation Results—

In many of the untreated piezoelectric elements, dielectric breakdown occurred after a lapse of 24 hours from the initiation of the voltage application.

On the other hand, in the treated piezoelectric elements 1, the leakage current value passed through the piezoelectric film 3 after a lapse of 24 hours from the initiation of the voltage application was about several ten nA.

The evaluation results confirmed that treating the inkjet head 20 by the treatment method of this example allows providing the inkjet head 20 capable of stably working in a high humidity environment.

The present embodiment offers the same effect as that obtained in Embodiment 1.

In this embodiment, the oscillation plate 2 functions also as the lower electrode, but the oscillation plate and the lower electrode may be formed separately.

In this embodiment, the upper electrode 4 is exposed to the zirconium compound 6 in a liquid state. However, the zirconium compound 6 may be in a gaseous state or dissolved in an organic solvent.

Other Embodiments

In the above embodiments, the piezoelectric film 3 is made of PZT. However, it may be made of any material as long as a lead compound is contained therein. The piezoelectric film 3 is preferably made of a material containing at least zirconium element, titanium element, lead element and oxygen element, e.g., lead lanthanum zirconate titanate (PLZT).

Further, in the above embodiments, the piezoelectric film 3 is formed on the lower electrode 2 by vacuum sputtering. However, the vacuum sputtering may be replaced with a zol-gel method or sintering.

In the above embodiments, used as the zirconium compound 6 are zirconium caprylate, zirconium t-butoxide and zirconium acetyl acetonate. However, the zirconium compound 6 may be any substance as long as it contains at least one of zirconium alkoxide, zirconium acetyl acetonate and zirconium carboxylate.

In the above embodiments, zirconium ethoxide or the like is used as an example of zirconium alkoxide. However, the present invention is not limited thereto and zirconium alkoxide in which an alkoxyl group is substituted with a methoxyl group or a butoxyl group may be used. Further, although zirconium caprylate or the like is used as an example of zirconium carboxylate, the present invention is not limited thereto and zirconium carboxylate in which a carboxyl group is substituted with a caproic group or a capric group may also be used.

In the above embodiments, the zirconium compound 6 is diluted with a 2-propanol solution, but the present invention is not limited thereto. The zirconium compound 6 may be diluted with an organic solvent, e.g., alcohols such as ethanol and buthanol and alkane such as tetradecane.

In the above embodiments, only the surface of the upper electrode 4 is exposed to the zirconium compound 6. However, it is only necessary that at least one of the upper and lower electrodes 4 and 2 is exposed to the zirconium compound 6.

In the above embodiments, the shared electrode and the separated electrode are constituted of the lower electrode 2 and the upper electrode 4, respectively. However, the upper electrode 4 may serve as the shared electrode and the lower electrode 2 may function as the separated electrode.

INDUSTRIAL APPLICABILITY

As described above, the present invention is useful for ink discharge actuators in inkjet printers, magnetic head drive actuators in hard disk drives, as well as displacement sensors.

The invention claimed is:

1. A piezoelectric element comprising a first electrode, a second electrode and a lead compound-containing piezoelectric body sandwiched between the first and second electrodes, wherein the piezoelectric body is made of an aggregate of a plurality of crystals, zirconium oxide exists at a grain boundary between the crystals and zirconium element exists at the grain boundary in a larger composition ratio than lead element.

2. A piezoelectric element according to claim 1, wherein the piezoelectric body is made of an aggregate of a plurality of columnar crystals which are oriented from one end to the other of the piezoelectric body in the thickness direction thereof.

3. A piezoelectric element according to claim 1, wherein the piezoelectric body contains at least zirconium element, titanium element, lead element and oxygen element.

4. An inkjet head comprising: a head body including a nozzle and a pressure chamber which is communicated with the nozzle and contains ink; and a piezoelectric element which is arranged to face the pressure chamber at part of one of its surfaces intersecting the thickness direction of the piezoelectric element and applies a pressure to the ink in the pressure chamber such that the ink is discharged from the nozzle to a recording medium, wherein the piezoelectric element includes a first electrode, a second electrode and a lead compound-containing piezoelectric body sandwiched between the first and second electrodes, the piezoelectric body is made of an aggregate of a plurality of crystals, zirconium oxide exists at a grain boundary between the crystals and zirconium element exists at the grain boundary in a larger composition ratio than lead element.

* * * * *

UNITED STATES PATENT AND TRADEMARK OFFICE
CERTIFICATE OF CORRECTION

| | | |
|---|---|---|
| PATENT NO. | : 7,475,967 B2 | Page 1 of 1 |
| APPLICATION NO. | : 10/539679 | |
| DATED | : January 13, 2009 | |
| INVENTOR(S) | : Tohru Nakagawa et al. | |

It is certified that error appears in the above-identified patent and that said Letters Patent is hereby corrected as shown below:

Title Page,

(*) Notice: Subject to any disclaimer, the term of this patent is extended or adjusted under 35 U.S.C. 154(b) by 341 days.

should read (*) Notice: Subject to any disclaimer, the term of this patent is extended or adjusted under 35 U.S.C. 154(b) by 552 days.

Signed and Sealed this

Thirty-first Day of August, 2010

David J. Kappos
*Director of the United States Patent and Trademark Office*